US010299399B2

(12) United States Patent
Yilmaz et al.

(10) Patent No.: US 10,299,399 B2
(45) Date of Patent: May 21, 2019

(54) WATERPROOF CASE

(71) Applicant: Friwo Gerätebau GmbH, Ostbevern (DE)

(72) Inventors: Taner Yilmaz, Münster (DE); Christopher Carsten Janse, Münster (DE)

(73) Assignee: FRIWO GERÄTEBAU GMBH, Ostbevern (DE)

( * ) Notice: Subject to any disclaimer, the term of this patent is extended or adjusted under 35 U.S.C. 154(b) by 37 days.

(21) Appl. No.: 15/364,738

(22) Filed: Nov. 30, 2016

(65) Prior Publication Data

US 2017/0156229 A1 Jun. 1, 2017

(30) Foreign Application Priority Data

Dec. 1, 2015 (EP) .................................... 15197188

(51) Int. Cl.
*H05K 5/02* (2006.01)
*H05K 5/06* (2006.01)

(52) U.S. Cl.
CPC .......... *H05K 5/069* (2013.01); *H05K 5/0247* (2013.01); *H05K 5/064* (2013.01)

(58) Field of Classification Search
None
See application file for complete search history.

(56) References Cited

U.S. PATENT DOCUMENTS 3,320,351 A * 5/1967 Glickman ............. H01L 23/047
174/50.56
3,778,529 A * 12/1973 Miller ................... H01F 27/022
174/153 G
3,829,332 A * 8/1974 Ozutsumi et al. .... H01M 2/1022
429/97
3,909,504 A * 9/1975 Browne ................. H05K 5/064
174/524
4,649,453 A * 3/1987 Iwasawa ................ G11B 15/10
206/811
5,440,455 A * 8/1995 Rottmar ................. G01D 11/30
361/809
5,793,615 A * 8/1998 Bach ................... B60R 16/0239
361/728
5,876,243 A * 3/1999 Sangawa ................. H01H 9/04
200/51 R (Continued)

FOREIGN PATENT DOCUMENTS

EP 1 622 438 A2 2/2006
WO WO 2013/051075 A1 4/2013

OTHER PUBLICATIONS

European Search Report issued in European Patent Application No. 15197188.4 dated Jun. 6, 2016, The Hague, 8 pgs.

*Primary Examiner* — Dimary S Lopez Cruz
*Assistant Examiner* — Muhammed Azam
(74) *Attorney, Agent, or Firm* — Brinks Gilson & Lione

(57) ABSTRACT

The waterproof case includes a case body, which defines an inner space for accommodating an electrically functional component. The waterproof case includes at least one opening, and at least one plug, which is mounted in the opening to form a part of a wall of the inner space. The plug includes at least one terminal conduit forming a feedthrough for a terminal. The plug is arranged in the opening to form with the case body an external space, and the external space is filled with an electrically insulating material for sealing the waterproof case.

20 Claims, 3 Drawing Sheets

(56) References Cited

U.S. PATENT DOCUMENTS

| | | | | |
|---|---|---|---|---|
| 6,368,149 B1* | 4/2002 | Schmidt | ............... | H05B 41/02 |
| | | | | 439/519 |
| 7,667,973 B2* | 2/2010 | Shinoda | ............... | H05K 5/0047 |
| | | | | 174/50 |
| 7,931,478 B2* | 4/2011 | Yamaguchi | ............ | H05K 7/026 |
| | | | | 361/752 |
| 7,936,566 B2* | 5/2011 | Shigyo | ............... | H05K 5/0052 |
| | | | | 137/14 |
| 8,279,609 B2* | 10/2012 | Rossi | ............... | A44C 15/0015 |
| | | | | 361/728 |
| 8,699,231 B2* | 4/2014 | Shinoda | ............ | H05K 5/0047 |
| | | | | 174/520 |
| 2002/0057360 A1* | 5/2002 | Abe | ............... | H04N 5/2252 |
| | | | | 348/373 |
| 2002/0173199 A1* | 11/2002 | Liegl | ............... | H01R 13/5216 |
| | | | | 439/519 |
| 2005/0047095 A1* | 3/2005 | Tomikawa | ............ | H05K 3/284 |
| | | | | 361/715 |
| 2009/0068862 A1* | 3/2009 | Honda | ............... | H05K 5/0052 |
| | | | | 439/78 |
| 2009/0279269 A1* | 11/2009 | Shiue | ............... | H05K 3/284 |
| | | | | 361/757 |
| 2010/0144194 A1* | 6/2010 | Umei | ............... | H05K 5/0247 |
| | | | | 439/521 |
| 2010/0206704 A1* | 8/2010 | Shimura | ............ | H01H 9/0214 |
| | | | | 200/302.2 |
| 2010/0326692 A1* | 12/2010 | Ozawa | ............... | B60R 16/0239 |
| | | | | 174/50.52 |
| 2011/0110794 A1* | 5/2011 | Mayleben | ............ | F04B 23/021 |
| | | | | 417/53 |
| 2011/0128194 A1* | 6/2011 | Sekine | ............... | H01Q 9/16 |
| | | | | 343/702 |
| 2012/0236479 A1* | 9/2012 | Tamai | ............... | B62D 5/0406 |
| | | | | 361/679.01 |
| 2013/0258616 A1* | 10/2013 | Chao | ............... | H05K 5/069 |
| | | | | 361/752 |
| 2014/0361933 A1* | 12/2014 | Zhang | ............... | H01Q 1/243 |
| | | | | 343/702 |
| 2015/0101842 A1* | 4/2015 | Han | ............... | B60R 16/0222 |
| | | | | 174/50.57 |
| 2016/0226084 A1* | 8/2016 | Itoga | ............... | H01M 8/04 |
| 2017/0156229 A1* | 6/2017 | Yilmaz | ............... | H05K 5/0247 |

* cited by examiner

WATERPROOF CASE

TECHNICAL FIELD

The present disclosure relates to a waterproof case for an electrical apparatus, to a power supply unit comprising such a waterproof case for supplying a consumer with low voltage, and to a corresponding method of assembling an electrical apparatus.

BACKGROUND

Power supply units supplying a consumer with a low voltage by transforming the supply voltage into the required low voltage by means of a voltage transformer are nowadays widely spread. It is necessary for certain applications, e.g. for charging outdoor equipment, that the power supply unit can be safely operated in moist environment. Here, the protection class IPx4, or even IPx7 has to be observed.

As is generally known, the so-called IP code (Ingress Protection) relates to the protection against splashing water all-around (IPx4) and the protection against temporary submersion (IPx7) according to the Standard DIN EN 60529 [DIN EN 60529 (VDE 0470-1):2000-09 *Protection Classes by casings (IP-Code) (IEC 60529:1989+A1:1999); German Version EN 60529:1991+A1:2000*. VDE-Verlag, Berlin].

DETAILED DESCRIPTION

In order to seal a casing in accordance with protection class IPx7, it is known, on the one hand, to arrange the power input lead, the output lead, and all components of the power supply unit within a casing and to fill this casing completely with an electrically insulating casting resin. An alternative to such a complete filling is the sealing of the casing by means of an ultrasonic welding seam. However, the ultrasonic welding alternative is not as process-reliable as the complete filling because the tightness depends on the quality of the welding seam and can be subject to certain unacceptable fluctuations. Filling the plug-in power supply unit completely, on the other hand, has the disadvantage that the weight and the material expenditure are relatively high and, moreover, that the detection of causes of failure is rendered more difficult due to the fact that all of the components are inseparably enclosed by the casting resin.

Furthermore, it was realized by the inventors of the present application that the encapsulation of all of the components with a casting resin may lead to leakage currents between the electric components, causes problems with electromagnetic interference (EMI), and leads to undesirable acoustic phenomena.

The object underlying the present disclosure is to provide a waterproof case for an electrical apparatus, a power supply unit and an associated manufacturing method allowing, on the one hand, the observance of a protection class which is suited for the operation in a moist area and, on the other hand, a significant reduction of manufacturing costs and the complexity.

This object is solved by the subject matter of the independent claims. Advantageous embodiments of the present disclosure are the subject matter of the dependent claims.

The present disclosure is based on the idea that a waterproof case for an electrical apparatus comprises a case body which defines an inner space for accommodating an electrically functional component and which comprises at least a first opening and at least one first plug which is mounted in said first opening to form a first part of a wall of the inner space. According to an advantageous embodiment, the case body comprises a second opening and at least one second plug which is mounted in said second opening to form a second part of said wall of the inner space.

Each of the first and second plugs comprises a terminal conduit forming a feedthrough for a first and a second terminal, respectively. In case that only one plug is provided, same may comprise two or more terminal conduits for leading the terminals to the outside.

Said first and second plugs are arranged in said first and second openings to form with said case body a first and a second external space, respectively, and said first and second external spaces are filled with an electrically insulating material in a finally mounted stage.

By filling only the external spaces with an electrically insulating filling material, the electronic components inside the case remain untouched by the filling material which is usually a casting compound. The filling material may be an epoxy resin or a silicone material. Advantageously, the filling material is flame retardant and meets the applicable standard regulations e. g. according to UL94 V0. Sealing the external spaces by means of a filling material is sufficient to prevent the ingress of humidity into the inner space where the electrically functional component is located. The external spaces are much smaller than the complete inner space, so that compared to a full encapsulation a significantly reduced amount of casting compound is needed when manufacturing the waterproof case. Moreover, in case a fault analysis or maintenance is required, or for recycling the electronic components after their useful lifetime, the waterproof housing may easily be separated from the electrically functional component.

The waterproof case according to the present disclosure is also much more robust than conventional housings because no ultrasonic welding seams are present.

Finally, due to the fact that only easily accessible external spaces have to be filled with a casting compound, the geometry of the injection molding tool can easily be adapted for a lot of different sizes and cross-sectional geometries of the waterproof case according to the present disclosure.

According to an advantageous embodiment of the present disclosure, the case body has a straight tubular shape. The first and second openings are the first and second ends of the tube and are closed by the first and second plugs, respectively. Such geometry has the advantage that apart from the interfaces between the plugs and the case body no seams and connecting areas are present. Thus, a smooth and robust outer surface of the waterproof case can be achieved.

A particularly economic way of fabricating the tubular case body is to manufacture it as an extruded profile, preferably from an electrically insulating plastic material.

According to an advantageous embodiment of the present disclosure, the case body has a rectangular inner cross-section and each of the first and second plugs have a rectangular outline, fitting into the inner cross-section of the case body. However, it is clear for a person skilled in the art that any other desired cross-sectional form, such as a circular, oval, or polygonal shape, may also be provided according to the present disclosure.

At least one of said first and second plugs may comprise a circumferential sealing element that engages with the case body in a sealing manner. This sealing element prevents the electrically insulating filling material from entering the inner space and from getting into contact with the electrically functional component. The sealing element may be a flexible grommet attached to an otherwise rigid material from which the plug is fabricated. Alternatively, the complete plug is formed from a flexible material and the sealing element is manufactured as an integral part thereof. Fabricating the plug in one part with the sealing element facilitates the manufacturing process and again reduces the number of critical material interfaces.

According to an advantageous embodiment of the present disclosure, at least one of the first and second terminal conduits is a cable conduit. Filling the external space with a filling material around a cable is particularly easy because no tight tolerances regarding the filling geometry have to be met. However, by providing an accordingly shaped connector outline, of course also a plug connector can be incorporated into one or both of the plugs.

In case the terminal is formed by a cable, the respective plug may comprise a strain relief element and/or a kink protection element for protecting the cable from being torn out or bent too sharply.

The concept of a waterproof case according to the present disclosure may advantageously be employed for a power supply unit that supplies a consumer with low-voltage electric power generated from a mains voltage power. In particular, the electrically functional component is formed by a voltage transformer unit comprising at least one electronic component for transforming the supply voltage into the low-voltage. This voltage transformer unit is accommodated inside the inner space of the case body and the input and output terminals are guided to the outside through the terminal conduits formed in the at least one first plug. Preferably, a first and a second plug are provided, the first plug having a first terminal conduit for said input terminal, and the second plug having a second terminal conduit for accommodating said output terminal.

In particular, the input terminal may be formed by a cable that is connectable to a mains voltage. Alternatively, also a plug connector, for instance a connector according to the standard IEC 60320 of the International Electrotechnical Commission (IEC), specifying non-locking appliance and interconnection couplers for connecting power supply cords to electrical appliances up to 250 volts, may be provided.

The output terminal may be formed either by a cable which is connectable to a consumer, or by a plug connector, such as a USB (universal serial bus) connector. In particular, a USB socket according to a USB Standard 1.0, 2.0 or 3.0 may be provided. Especially for charging mobile terminals such as mobile phones, a power supply unit with a USB connector is universally usable and, at the same time, mechanically stable and safe.

However, providing a cable which is directly sealed by means of the electrically insulating filling component represents the easiest and most economic way of connecting a power supply unit according to the present disclosure to a supply voltage and a consumer, respectively.

The present disclosure is also related to a method of assembling an electrical apparatus comprising the following steps:

Providing a case body which defines an inner space for accommodating an electrically functional component and which comprises a first and a second opening, inserting the functional component in an insertion direction along a longitudinal axis of said case body, inserting a first plug into said first opening to form a first part of a wall of the inner space and inserting a second plug into said second opening to form a second part of said wall of the inner space, each of the first and second plugs comprising a terminal conduit forming a feedthrough for a first and a second terminal, respectively, wherein said first and second plugs are arranged in said first and second openings to form with said case body a first and a second external space, respectively, and filling said first and second external spaces with an electrically insulating material.

Advantageously, the assembly method according to the present disclosure does not require any welding steps, in particular no ultrasonic welding, as this is required for most conventional power supply units. Moreover, the step of filling the first and second external spaces with an electrically insulating material serves two purposes: Firstly, the terminal conduits are hermetically sealed against ingress of humidity. Secondly, the terminals themselves are mechanically fixed at the case body. Hence, a particularly efficient and safe method of fabricating an electrical apparatus, in particular a power supply unit, is provided.

The accompanying drawings are incorporated into the specification and form a part of the specification to illustrate several embodiments of the present disclosure. These drawings, together with the description serve to explain the principles of the disclosure. The drawings are merely for the purpose of illustrating the preferred and alternative examples of how the disclosure can be made and used, and are not to be construed as limiting the disclosure to only the illustrated and described embodiments. Furthermore, several aspects of the embodiments may form—individually or in different combinations—solutions according to the present disclosure. The following described embodiments thus can be considered either alone or in an arbitrary combination thereof. Further features and advantages will become apparent from the following more particular description of the various embodiments of the disclosure, as illustrated in the accompanying drawings, in which like references refer to like elements, and wherein:

Figure 1:
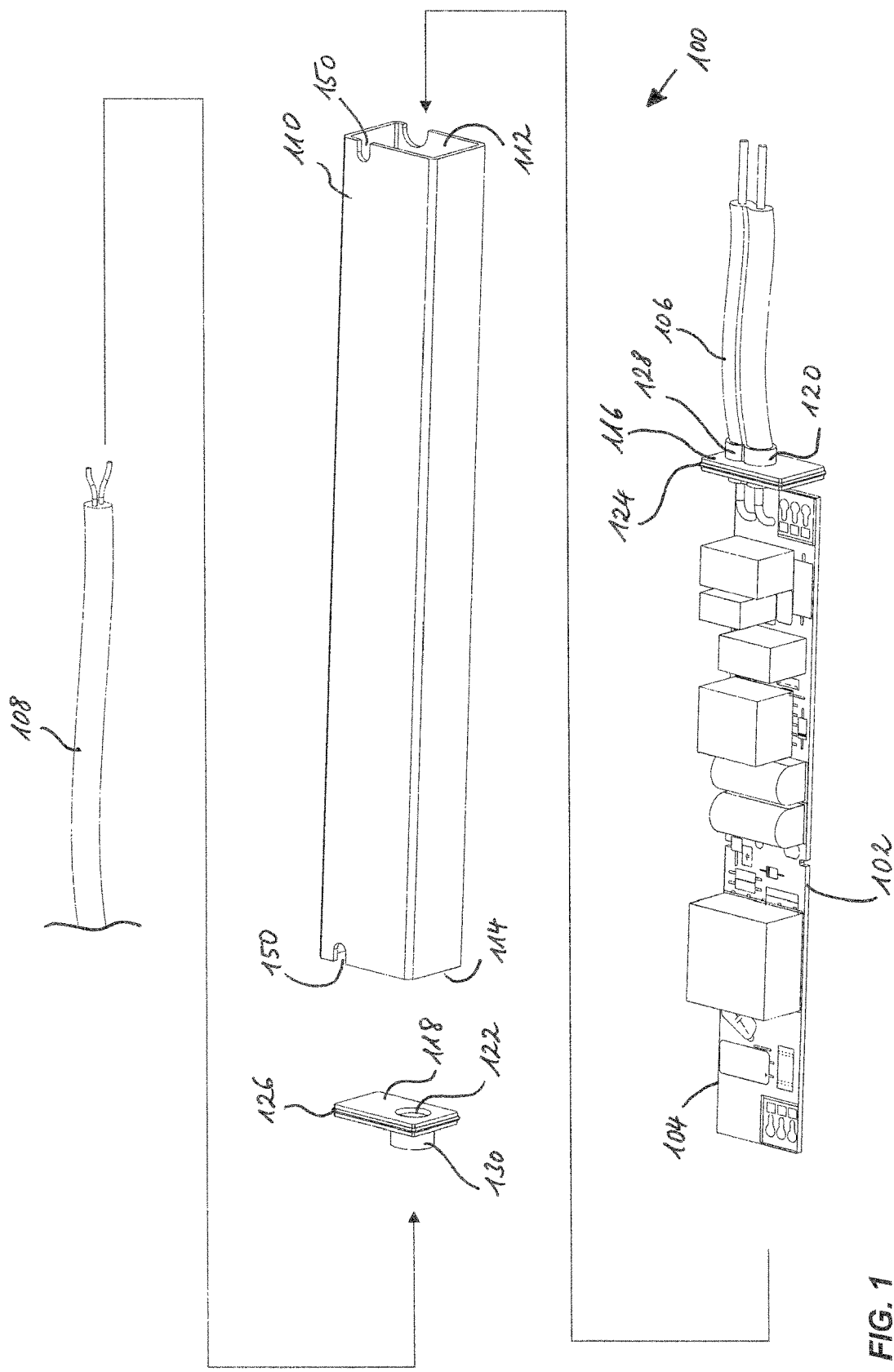
FIG. 1 is a schematic exploded view of a power supply unit according to the present disclosure.

The present disclosure will now be explained in more detail with reference to the Figures and firstly referring to FIG. 1. FIG. 1 shows a schematic exploded view of a power supply unit 100 that can benefit from the ideas according to the present disclosure.

The active electronic devices, such as for instance a transformer and a controller, are assembled on a circuit carrier, preferably a printed circuit board (PCB) 102, to form an electrically functional component 104. A primary sided input cable 106 can be connected to a mains voltage, for instance by means of a mains plug (not shown in the Figures). On a low-voltage secondary side, a consumer can be connected to the electrically functional component 104 via an output cable 108.

According to the present disclosure, the electrically functional component 104 is accommodated inside a case body 110. The case body 110 advantageously is formed as an extruded profile from an electrically insulating plastic material. As shown in FIG. 1, the case body may have an essentially rectangular cross-section defining an inner space (better visible in FIG. 3) for receiving the electrically functional component 104. Of course, also any other suitable cross-section can be chosen. Advantageously, the case body 110 forms an almost completely closed housing only provided with a first and a second opening 112, 114 at its first and second ends.

These openings 112, 114 are closed by means of a first and a second plug 116, 118. Preferably, the first and the second plug 116, 118 each have a terminal conduit 120, 122 for leading therethrough the first and second cable 106, 108, respectively. The first and second plugs 116, 118 have an outline shaped to fit into the inner surface of the openings 112, 114. As will become more apparent from FIGS. 4 and 5, each of the plugs has a circumferential seal 124, 126. In the embodiment shown in FIG. 1, each of the plug 116, 118 is formed from a flexible plastic material and the seals 124, 126 are integrally formed with the plugs 116, 118.

However, it is clear for a person skilled in the art that the seals 124, 126 may also consist of a different material than the rest of the plugs 116, 118. In particular, the plugs 116, 118 may be formed from a rigid material, whereas the elastic seals 124, 126 are formed from a resilient material. Moreover, the first and second plugs 116, 118 do not necessarily have to be constructed from identical materials, but may differ from each other.

According to the present disclosure, both plugs 116, 118 are provided with kink protection elements 128, 130. These kink protection elements 128, 130 prevent the cables 106, 108 from being bent too sharply at the terminal conduits 120, 122.

Figure 2:
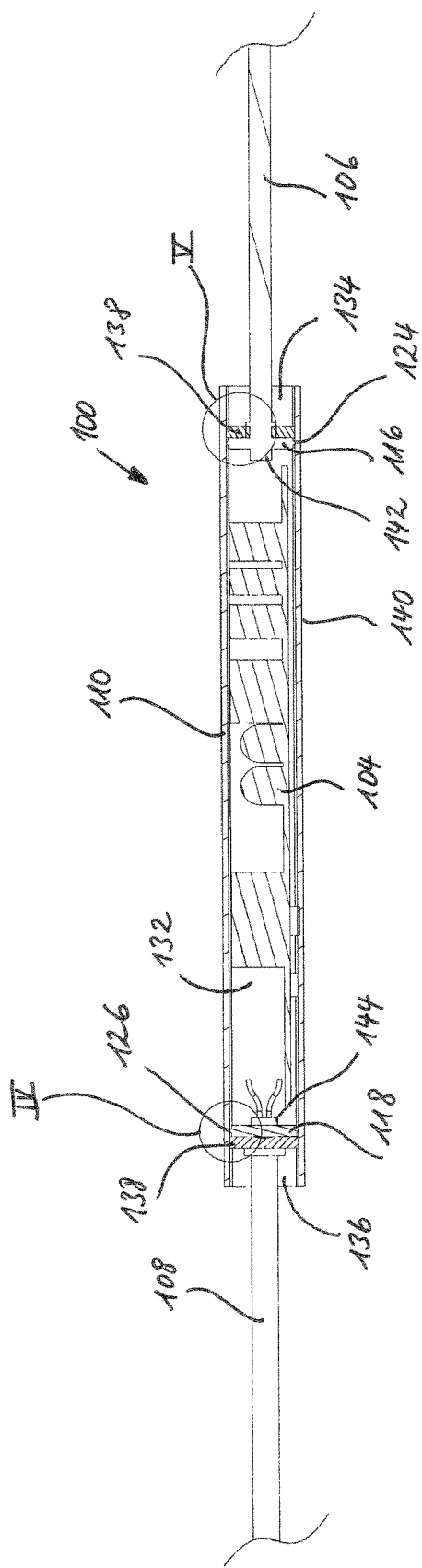
FIG. 2 is a schematic sectional view of the power supply shown in FIG. 1.

The assembled construction of the power supply unit 100 according to the present disclosure becomes more apparent from the cross-sectional view shown in FIG. 2. In the assembled state, the electrically functional component 104 is accommodated within an inner space 132 of the case body 110. The inner space 132 is delimited on both distal ends by the first and second plug 116, 118, respectively. According to the present disclosure, the inserted first and second plug, 116, 118 define together with the case body 110 a first and a second external space 134, 136. The external spaces 134, 136 are filled with an electrically insulating filling material 138. Preferably, the filling material 138 is formed by an electrically insulating, flame protected casting resin. The filling material 138 may comprise any suitable casting resin, for instance an epoxy resin or a silicone material.

The filling material 138 is filled in with a thickness of about 5 mm and provides a hermetic sealing of the case body 110 which forms together with the plugs 116, 118 and the filling material 138 a waterproof case 140.

As mentioned above, each of the plugs comprises a circumferential sealing element 124 126 which interacts with the inner surface of the case body 110 to seal it against intrusion of the casting resin into the inner space 132.

In order to prevent that the cables 106, 108 are pulled out, strain relief elements 142, 144 are provided at the first and second plugs 116, 118.

Figure 3:
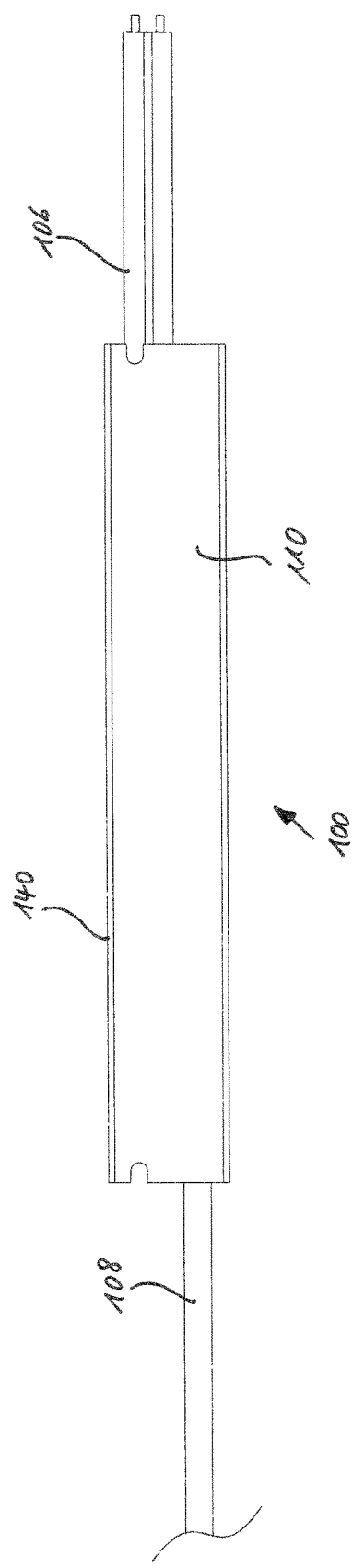
FIG. 3 is a top view of the power supply shown in FIG. 1.

FIG. 3 shows a top view of the power supply unit according to the present disclosure. The length of the case body 110 advantageously can be adapted to the spatial requirements of the respective application environment.

Figure 4:
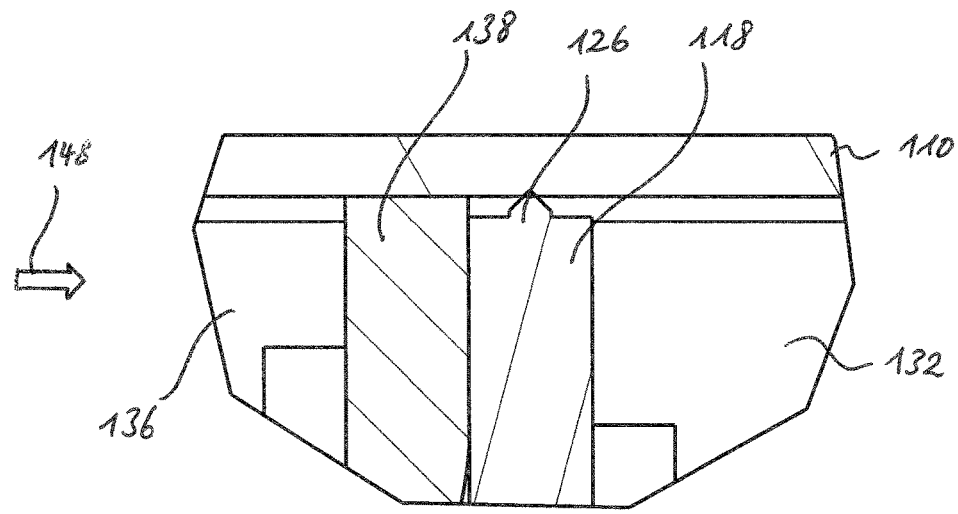
FIG. 4 is a first detail of FIG. 2.
Figure 5:
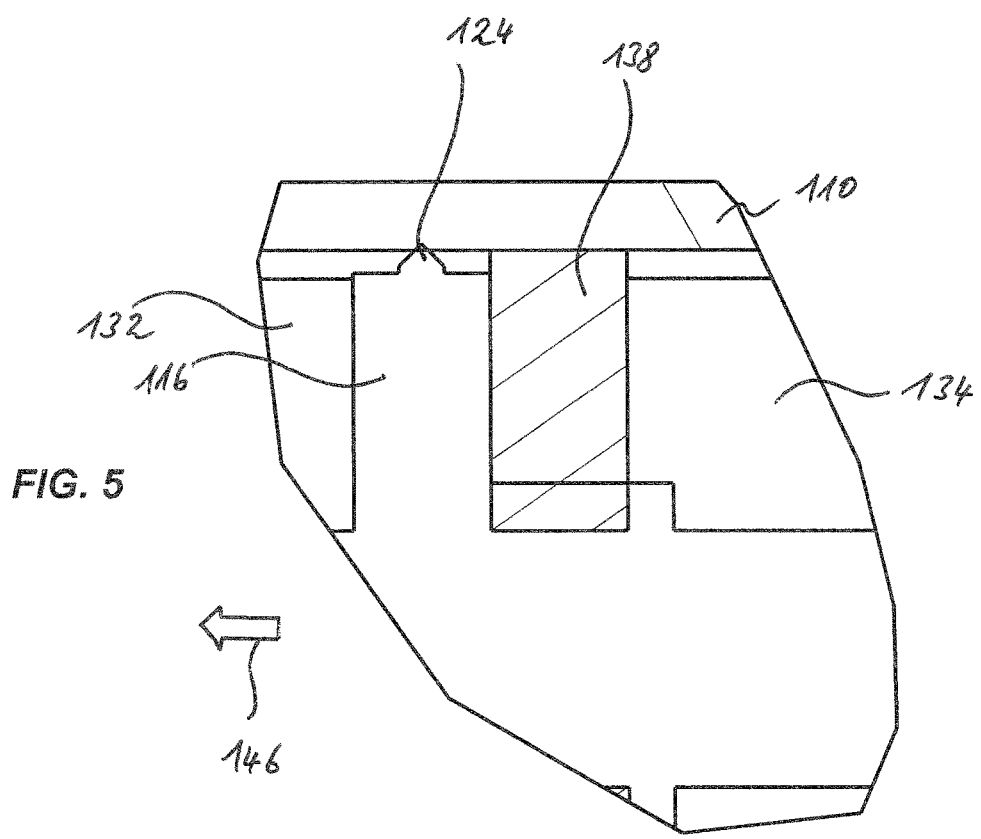
FIG. 5 is a second detail of FIG. 2.

FIGS. 4 and 5 illustrate a first detail IV and a second detail V shown in FIG. 2. As may be derived from these Figures, each of the plugs 116, 118 is formed to be slidable in a direction along the longitudinal axis of the case body 110. This direction is schematically indicated by the arrows 146, 148. The final fixing of the plugs 116, 118 within the case body 110 is effected by filling in the casting resin 138. Seal elements 124, 126 interact with the inner wall of the case body 110 to prevent any filling material 138 from entering the inner space 132. Advantageously, the filling material 138 comprises a flame protected plastic material.

The filling material 138 may have any suitable thickness in order to sufficiently fix the plugs 116, 118 within the case body 110 and in order to seal the openings 112, 114 against the intrusion of humidity. It could be shown that for conventional table power supplies a thickness of about 5 mm is advantageous.

With reference to the FIGS. 1 to 4, the procedure for assembling a power supply unit 100 according to the present disclosure will be explained in the following.

In a first step, a printed circuit board (PCB) 102 is assembled with electronic components for transforming the supply voltage into a low-voltage to form a transformer unit 104. A case body 110 which has an essentially tube-shaped geometry with a rectangular cross-section is fabricated preferably as an extruded profile from an electrically insulating plastic material.

Next, a first plug 116 is assembled at a cable 106 which is connected to the transformer unit 104. The transformer unit 104 is inserted into the case body 110. The first plug 116 has a rectangular outline matching with the inner cross-section of the case body 110. The first plug 116 is slidable within the case body 110 along the direction 146 and has an elastic circumferential sealing means 124 which is pressed against the inner wall of the case body 110.

In the next step, the low-voltage cable 108 is inserted through the terminal conduit 122 of a second plug 118. The cable ends are connected to the transformer unit 104 (not shown in the Fig.) and the plug 118 is positioned within the case body 110 to form a second external space 136. Also the second plug 118 has an outline corresponding to the inner cross-section of the case body 110 in a way that it is slidable, while the circumferential sealing element 126 pressed against the inner wall of the case body 110.

In a final step, a filling material 138 is filled into both external spaces 134, 136 in order to seal the waterproof case 140 and to mechanically fix the plugs 116, 118 at the case body 110. The case body 110 has cutouts 150 which facilitate filling in a filling material 138, preferably a casting resin.

By filling the external spaces 134, 136 with the filling material, the interface between the case body 110 and the plugs 116, 118 as well as the interface between the cables 106, 108 and the terminal conduits 120, 122 are hermetically sealed, at the same time mechanically fixing the plugs at the case body 110.

The power supply unit according to the present disclosure provides a waterproof product that meets the requirements of IPx7 and all relevant electric safety standards. Moreover, the length of the case body can easily be adapted to different geometric requirements. By using a casting resin only for filling the external spaces, the electronic components are not covered by a casting resin. This is advantageous in view of the EMI and acoustic characteristics during operation, but also for maintenance and recycling reasons.

Although in the above Figures only an embodiment is shown wherein two plugs are provided each with one terminal conduit, it is clear to a person skilled in the art that the concept according to the present disclosure may also be used when providing only one plug with more than one terminal conduit or when providing a plurality of plugs with one or more terminal conduits.

The invention claimed is:

1. Waterproof case for an electrical apparatus, comprising:
   a case body which defines an inner space for accommodating an electrically functional component and which comprises at least one first opening,
   at least one first plug which is mounted in said first opening to form a first part of a wall of the inner space, wherein the first plug comprises at least one first terminal conduit forming a feedthrough for a first terminal, wherein said first plug is arranged in said first opening to form with said case body a first external space, and wherein said first external space is filled with an electrically insulating material for sealing said waterproof case.

2. Waterproof case according to claim 1, further comprising at least one second plug which is mounted in a second opening of the case body to form a second part of said wall of the inner space, wherein the second plug comprises at least one second terminal conduit forming a feedthrough for a second terminal, wherein second plug is arranged in said second opening to form with said case body a second external space, and wherein said second external space is filled with said electrically insulating material.

3. Waterproof case according to claim 1, wherein said case body has a straight tubular shape and is fabricated as an extruded profile.

4. Waterproof case according to claim 2, wherein said case body has a rectangular inner cross-section and wherein each of the first and second plugs have a rectangular outline fitting into the inner cross-section of the case body.

5. Waterproof case according to claim 1, wherein said case body is fabricated from an electrically insulating plastic material.

6. Waterproof case according to claim 2, wherein at least one of said first and second plugs comprises a circumferential sealing element that engages with said case body in a sealing manner.

7. Waterproof case according to claim 2, wherein at least one of said first and second plugs is fabricated from a flexible material.

8. Waterproof case according to claim 2, wherein at least one of the first and second terminal conduits is a cable conduit for feeding through a cable.

9. Waterproof case according to claim 8, wherein at least one of said first and second plugs comprises a strain relief element for providing strain relief of said cable.

10. Waterproof case according to claim 8, wherein at least one of said first and second plugs comprises a kink protecting element for protecting said cable.

11. Waterproof case according to claim 1, further comprising:

a power supply unit for supplying a consumer with low-voltage electric power generated from a mains voltage power, said power supply unit comprising:

at least one input terminal for connecting the power supply unit to a supply voltage source, at least one output terminal for outputting the low voltage, a voltage transformer unit comprising at least one electronic component for transforming the supply voltage into the low voltage, wherein said waterproof case accommodates the voltage transformer unit.

12. Waterproof case according to claim 11, wherein said input terminal is a cable which is connectable to a mains voltage.

13. Waterproof case according to claim 11, wherein said output terminal is a cable which is connectable to a consumer or wherein said output terminal comprises a USB connector.

14. Waterproof case according to claim 1, wherein a surface of the first plug defines a portion of the inner space, and wherein the electrically insulating material is positioned between the first plug and the external space.

15. Waterproof case according to claim 1, wherein the electrical apparatus is spaced away from the first plug.

16. Waterproof case according to claim 1, wherein the first plug is mechanically fixed by the insulation material to the case body.

17. Waterproof case according to claim 16, wherein the first plug is fabricated from a flexible material with an integrally formed circumferential seal that engages with said case body in a sealing manner.

18. Waterproof case according to claim 17, wherein the first plug is inserted into said first opening and forms, with said case body, said first external space.

19. Waterproof case according to claim 18, wherein the first opening is arranged at a distal end of said case body.

20. Waterproof case according to claim 1, wherein the first external space comprises a space within the case body between the first plug and the first opening of the case body.

* * * * *